United States Patent
Raad et al.

(10) Patent No.: US 11,136,060 B2
(45) Date of Patent: Oct. 5, 2021

(54) STEERING NIBBLE CONTROL

(71) Applicant: Ford Global Technologies, LLC, Dearborn, MI (US)

(72) Inventors: Joseph M. Raad, Farmington, MI (US); Darrel Alan Recker, Ypsilanti, MI (US); Jan Bremkens, Straelen (DE); Daniel Slavin, Northville, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 186 days.

(21) Appl. No.: 16/279,636

(22) Filed: Feb. 19, 2019

(65) Prior Publication Data

US 2020/0262472 A1    Aug. 20, 2020

(51) Int. Cl.
*B62D 7/22*      (2006.01)
*B62D 5/04*      (2006.01)
*H03J 3/08*      (2006.01)
*H04L 27/18*     (2006.01)

(52) U.S. Cl.
CPC .............. *B62D 5/0463* (2013.01); *H03J 3/08* (2013.01); *H04L 27/18* (2013.01)

(58) Field of Classification Search
CPC .... B62D 5/0463; B62D 7/224; B62D 5/0472; H03J 3/08; H04L 27/18
See application file for complete search history.

(56) References Cited

U.S. PATENT DOCUMENTS

| | | | |
|---|---|---|---|
| 8,219,283 B2 | 7/2012 | Recker et al. | |
| 8,267,220 B2 | 9/2012 | Sugiyama et al. | |
| 8,632,096 B1 | 1/2014 | Quinn et al. | |
| 9,002,583 B2 | 4/2015 | Gruener et al. | |
| 9,440,674 B2 * | 9/2016 | Oblizajek | B62D 5/0472 |
| 2002/0105233 A1 * | 8/2002 | Vice | H02M 1/12 307/105 |
| 2009/0000857 A1 | 1/2009 | Sugiyama et al. | |
| 2009/0125186 A1 * | 5/2009 | Recker | B62D 5/0472 701/41 |
| 2009/0192679 A1 * | 7/2009 | Kobayashi | B62D 5/0466 701/42 |
| 2012/0061169 A1 | 3/2012 | Oblizajek et al. | |

(Continued)

FOREIGN PATENT DOCUMENTS

| | | |
|---|---|---|
| CN | 104908807 A | 9/2015 |
| DE | 102010031211 A1 | 1/2012 |

(Continued)

OTHER PUBLICATIONS

Wikipedia.org, "All-pass filter," accessed Mar. 18, 2021, https://en.wikipedia.org/wiki/All-pass_filter (Year: 2021).*

*Primary Examiner* — Donald J Wallace
*Assistant Examiner* — Daniel M. Robert
(74) *Attorney, Agent, or Firm* — Ray Coppiellie; Bejin Bieneman PLC (57) ABSTRACT

A steering system includes an electric motor drivably coupled to a steering column, and a computer communicatively coupled to the electric motor. The computer is programmed to isolate a nibble signal in data representing a torque of the steering column, and instruct the electric motor to output a motor torque based on the nibble signal shifted by a phase shift, the phase shift based on a vehicle-wheel frequency.

20 Claims, 4 Drawing Sheets

(56) References Cited

U.S. PATENT DOCUMENTS

| | | | |
|---|---|---|---|
| 2014/0277946 A1 | 9/2014 | Oblizajek et al. | |
| 2015/0094912 A1 | 4/2015 | Sukaria et al. | |
| 2017/0174255 A1 | 6/2017 | Kim | |
| 2019/0023311 A1* | 1/2019 | Nishimura | ........... B62D 5/0463 |
| 2019/0144031 A1* | 5/2019 | Bremkens | ............ B62D 15/021 |
| | | | 180/446 |

FOREIGN PATENT DOCUMENTS

| | | | |
|---|---|---|---|
| EP | 1650106 B1 | 1/2009 | |
| JP | 2005022468 A | 1/2005 | |
| JP | 4134158 B2 | 6/2008 | |
| KR | 100814758 B1 | 3/2008 | |
| KR | 20170075601 A | 7/2017 | |
| KR | 20170135032 A | 12/2017 | |
| WO | WO-2017204987 A1 * | 11/2017 | ........... H04B 10/118 |

* cited by examiner

STEERING NIBBLE CONTROL

BACKGROUND

Steering nibble is a rotational vibration experienced by a driver of a vehicle through the steering system mainly during straight-line driving. Steering nibble can be caused by variations in the force between the tires and the ground, i.e., from an imbalance in the front wheels of the vehicle. When the front wheels rotate, a force variation from the imbalance is transmitted through the steering system to the steering wheel. Vehicle drivers find steering nibble to be undesirable.

DETAILED DESCRIPTION

The steering system described below actively reduces the steering nibble experienced by the driver of a vehicle. The magnitude and frequency of the steering nibble depends on the wheel speed of the vehicle. The steering system can operate to actively cancel out the steering nibble. In particular, the steering system uses phase compensation to actively cancel out the steering nibble for a wide range of frequencies of nibble, including frequencies above, at, and below the resonant frequency of the steering system. The phase response of the steering system can include a 180° phase change around the resonant frequency.

The steering system includes an electric motor drivably coupled to a steering column, and a computer communicatively coupled to the electric motor. The computer is programmed to isolate a nibble signal in data representing a torque of the steering column, and instruct the electric motor to output a motor torque based on the nibble signal shifted by a phase shift, the phase shift based on a vehicle-wheel frequency.

The electric motor may be an electric-power-assist-steering motor. The motor torque may be a sum of (1) a power-assist torque determined from the steering-column torque and (2) the nibble signal shifted by the phase shift.

The steering system may further include a torque sensor communicatively coupled to the computer and positioned to detect a torque of the steering column.

The steering system may further include a vehicle wheel turnable by the steering column, and a wheel-speed sensor communicatively coupled to the computer and positioned to detect rotation of the vehicle wheel.

A computer includes a processor and a memory storing instructions executable by the processor to isolate a nibble signal in data representing a steering-column torque, and instruct an electric motor to output a motor torque based on the nibble signal shifted by a phase shift, the phase shift based on a vehicle-wheel frequency.

Shifting the nibble signal by the phase shift may include applying an all-pass filter to the nibble signal. The all-pass filter may be a second-order all-pass filter. The all-pass filter may have a transfer function equal to $$\frac{s^2 - 2f_{res}s + f_{res}^2}{s^2 + 2f_{res}s + f_{res}^2}$$

in which $$f_{res} = \frac{f_{wheel}}{\tan((360° - \varphi(f_{wheel}))\frac{\pi}{4*180°})}$$

in which $f_{wheel}$ is the vehicle-wheel frequency and $\varphi(f_{wheel})$ is the phase shift.

The memory may store a lookup table of vehicle-wheel frequencies paired with phase shifts, wherein the phase shifts substantially minimize uncompensated nibble at the respective vehicle-wheel frequencies.

Shifting the nibble signal by the phase shift may include time-delaying the nibble signal.

The motor torque may be a sum of (1) a power-assist torque determined from the steering-column torque and (2) an inversion of the nibble signal shifted by the phase shift.

Isolating the nibble signal may include applying a tuned resonator software filter.

A method includes isolating a nibble signal in data representing a steering-column torque, and instructing an electric motor to output a motor torque based on the nibble signal shifted by a phase shift, the phase shift based on a vehicle-wheel frequency.

Shifting the nibble signal by the phase shift may include applying an all-pass filter to the nibble signal. The all-pass filter may be a second-order all-pass filter. The all-pass filter may have a transfer function equal to $$\frac{s^2 - 2f_{res}s + f_{res}^2}{s^2 + 2f_{res}s + f_{res}^2}$$

in which $$f_{res} = \frac{f_{wheel}}{\tan((360° - \varphi(f_{wheel}))\frac{\pi}{4*180°})}$$

in which $f_{wheel}$ is the vehicle-wheel frequency and $\varphi(f_{wheel})$ is the phase shift.

The method may further include determining the phase shift by consulting a lookup table of vehicle-wheel frequencies paired with phase shifts, and the phase shifts may substantially minimize uncompensated nibble at the respective vehicle-wheel frequencies.

The motor torque may be a sum of (1) a power-assist torque determined from the steering-column torque and (2) an inversion of the nibble signal shifted by the phase shift.

Isolating the nibble signal may include applying a tuned resonator software filter.

With reference to the Figures, a steering system 32 for a vehicle 30 includes an electric motor 34 drivably coupled to a steering column 36, and a computer 38 communicatively coupled to the electric motor 34. The computer 38 is programmed to isolate a nibble signal in data representing a torque of the steering column 36, and instruct the electric motor 34 to output a motor torque based on the nibble signal shifted by a phase shift, the phase shift based on a vehicle-wheel frequency.

Figure 1:
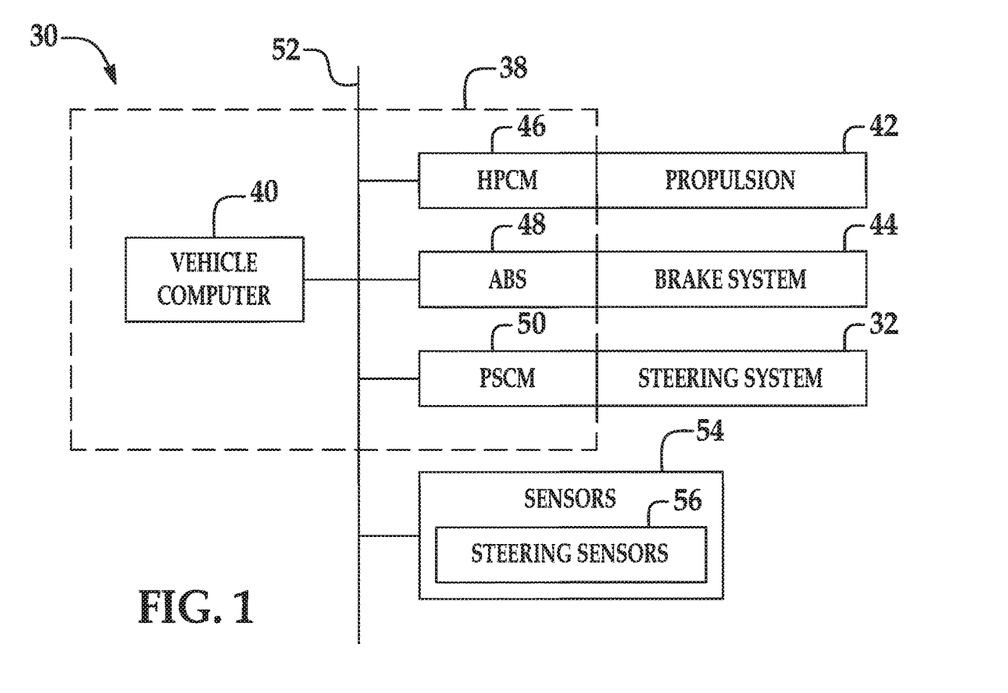
FIG. 1 is a block diagram of an example vehicle.

With reference to FIG. 1, the vehicle 30 may be an autonomous or semi-autonomous vehicle. A vehicle computer 40 can be programmed to operate the vehicle 30 independently of the intervention of a human driver, completely or to a lesser degree. The vehicle computer 40 may be programmed to operate a propulsion 42, a brake system 44, the steering system 32, and/or other vehicle systems. For the purposes of this disclosure, autonomous operation means the vehicle computer 40 controls the propulsion 42, brake system 44, and steering system 32 without input from a human driver; semi-autonomous operation means the vehicle computer 40 controls one or two of the propulsion 42, brake system 44, and steering system 32 and a human driver controls the remainder, or that the vehicle computer 40 controls the propulsion 42, brake system 44, and steering system 32 without input from a human driver in predefined contexts and not outside those contexts; and nonautonomous operation means a human driver controls the propulsion 42, brake system 44, and steering system 32.

The vehicle computer 40 is a microprocessor-based computer. The vehicle computer 40 includes a processor, memory, etc. The memory of the vehicle computer 40 includes memory for storing instructions executable by the processor as well as for electronically storing data and/or databases.

The computer 38 is one or more microprocessor-based computers. The computer 38 includes memory, at least one processor, etc. The memory of the computer 38 includes memory for storing instructions executable by the processor as well as for electronically storing data and/or databases. The computer 38 may be the same computer as the vehicle computer 40, or the computer 38 may be one or more separate computers in communication with the vehicle computer 40 via a communications network 52, or the computer 38 may encompass multiple computers including the vehicle computer 40. As a separate computer, the computer 38 may be or include, e.g., one or more electronic control units or modules (ECU or ECM) such as a hybrid-powertrain control module 46, an antilock brake control module 48, and/or a power-steering control module 50.

The computer 38 may transmit and receive data through the communications network 52, which may be a controller area network (CAN) bus, Ethernet, WiFi, Local Interconnect Network (LIN), onboard diagnostics connector (OBD-II), and/or by any other wired or wireless communications network. The computer 38 may be communicatively coupled to the vehicle computer 40, the other ECMs 46, 48, 50, the propulsion 42, the brake system 44, the steering system 32 (e.g., the electric motor 34), sensors 54 including steering sensors 56, and other components via the communications network 52.

The propulsion 42 of the vehicle 30 generates energy and translates the energy into motion of the vehicle 30. The propulsion 42 may be a known vehicle propulsion subsystem, for example, a conventional powertrain including an internal-combustion engine coupled to a transmission that transfers rotational motion to vehicle wheels 58; an electric powertrain including batteries, an electric propulsion motor, and a transmission that transfers rotational motion to the vehicle wheels 58; a hybrid powertrain including elements of the conventional powertrain and the electric powertrain; or any other type of propulsion. The propulsion 42 can include an electronic control module or the like that is in communication with and receives input from the vehicle computer 40 and/or a human driver, e.g., the hybrid-powertrain control module 46. The human driver may control the propulsion 42 via, e.g., an accelerator pedal and/or a gearshift lever.

The brake system 44 is typically a known vehicle braking subsystem and resists the motion of the vehicle 30 to thereby slow and/or stop the vehicle 30. The brake system 44 may include friction brakes such as disc brakes, drum brakes, band brakes, etc.; regenerative brakes; any other suitable type of brakes; or a combination. The brake system 44 can include an electronic control module or the like that is in communication with and receives input from the vehicle computer 40 and/or a human driver, e.g., the antilock brake control module 48. The human driver may control the brake system 44 via, e.g., a brake pedal.

The steering system 32 is typically a known vehicle steering subsystem and controls the turning of the vehicle wheels 58. The steering system 32 may be a rack-and-pinion system with electric power-assisted steering, a steering-column system, a steer-by-wire system, as are known, or any other suitable system. The steering system 32 can include an electronic control module or the like that is in communication with and receives input from the vehicle computer 40 and/or a human driver, e.g., the power-steering control module 50. The human driver may control the steering system 32 via, e.g., a steering wheel 60, handheld remote control (not shown), etc.

The sensors 54 provide data for autonomous operation of the vehicle 30. The sensors 54 may provide data about operation of the vehicle 30, for example, engine and transmission data such as temperature, fuel consumption, etc.; the steering sensors 56 (described below); etc. The sensors 54 may detect the location and/or orientation of the vehicle 30. For example, the sensors 54 may include global positioning system (GPS) sensors; accelerometers such as piezo-electric or microelectromechanical systems (MEMS); gyroscopes such as rate, ring laser, or fiber-optic gyroscopes; inertial measurements units (IMU); and magnetometers. The sensors 54 may detect the external world, e.g., objects and/or characteristics of surroundings of the vehicle 30, such as other vehicles, road lane markings, traffic lights and/or signs, pedestrians, etc. For example, the sensors 54 may include radar sensors, scanning laser range finders, light detection and ranging (LIDAR) devices, and image processing sensors such as cameras. The sensors 54 may include communications devices, for example, vehicle-to-infrastructure (V2I) or vehicle-to-vehicle (V2V) devices.

Figure 2:
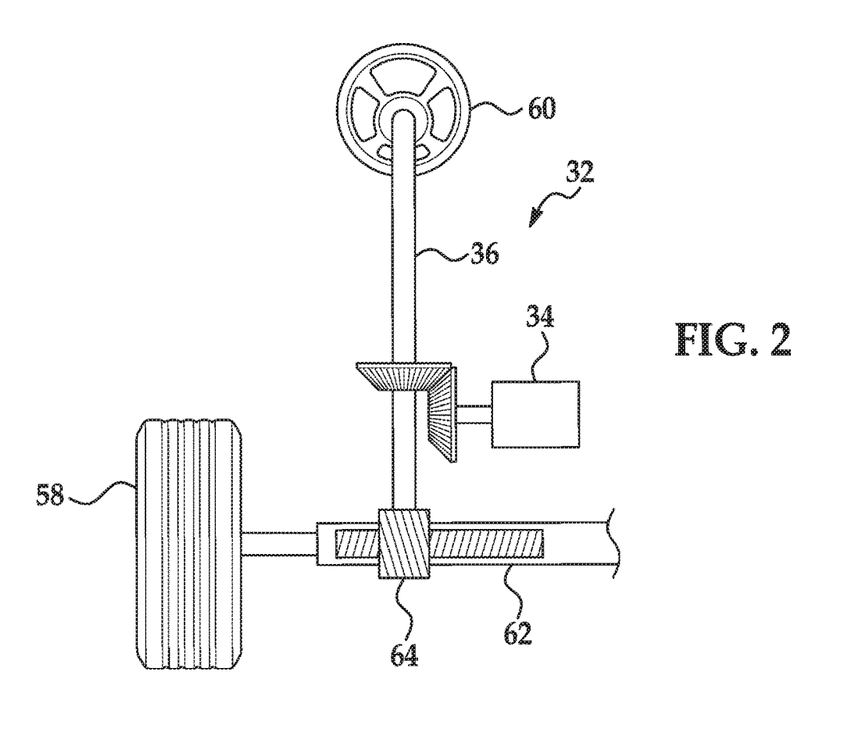
FIG. 2 is a diagram of an example steering system of the vehicle.

With reference to FIG. 2, the steering system 32 may be a conventional rack-and-pinion steering system. Alternatively or additionally, the steering system 32 may be a Pitman-arm system, a rear-steer system, etc. (not shown). A steering rack 62 may be turnably coupled to the vehicle wheels 58, for example, in a four-bar linkage. The position of the steering rack 62 determines the turning of the vehicle wheels 58. Translational motion of the steering rack 62 results in turning of the vehicle wheels 58. The steering column 36 may be coupled to the steering rack 62 via a pinion gear 64, that is, gear meshing between the pinion gear 64 and the steering rack 62.

The steering column 36 transfers rotation of the steering wheel 60 to movement of the steering rack 62. The steering column 36 may be, e.g., a shaft connecting the steering wheel 60 to the steering rack 62. The steering column 36 may house a clutch and one or more of the steering sensors 56 such as a torque sensor (not shown).

The steering wheel 60 allows an operator to steer the vehicle 30 by transmitting rotation of the steering wheel 60 to movement of the steering rack 62. The steering wheel 60 may be, e.g., a rigid ring fixedly attached to the steering column 36 such as is known.

The electric motor 34 is coupled to the steering system 32, e.g., drivably coupled to the steering column 36, so as to cause turning of the vehicle wheels 58. For example, the electric motor 34 may be rotatably coupled to the steering column 36, that is, coupled so as to be able to apply a steering torque to the steering column 36. The electric motor 34 may be an electric-power-assist-steering motor, i.e., provide power assist to the steering system 32. In other words, the electric motor 34 may provide torque in a direction in which the steering wheel 60 is being rotated by a human driver, allowing the driver to turn the steering wheel 60 with less effort.

Alternatively to the rack-and-pinion steering system, the steering system 32 may be a steer-by-wire steering system, i.e., may have a gap in mechanical linkages between the steering wheel 60 and the vehicle wheels 58. If the vehicle 30 is a fully autonomous vehicle, the steering system 32 may be a steer-by-wire steering system lacking the steering wheel 60 and the steering column 36. The computer 38, e.g., the power-steering control module 50, may receive signals from the steering sensors 56, e.g., a position sensor positioned to detect the orientation of the steering wheel 60, or from the vehicle computer 40. The position sensor may be, e.g., a Hall effect sensor, a rotary encoder, etc. The computer 38 may output a signal to the electric motor 34. The electric motor 34 may be one or more electromechanical actuators coupled to the steering rack 62 in lieu of the pinion gear 64, and the electric motor 34 may transform the signal into mechanical motion of the steering rack 62.

Returning to FIG. 1, the steering sensors 56 provide data about components of the steering system 32. For example, the steering sensors 56 include wheel-speed sensors positioned to detect rotation of the vehicle wheels 58; position sensors on components of the steering system 32 such as the steering wheel 60, the steering column 36, the steering rack 62, or the pinion gear 64; and torque sensors positioned to detect torques of components of the steering system 32 such as the steering column 36, the pinion gear 64, or the electric motor 34.

Figure 3:
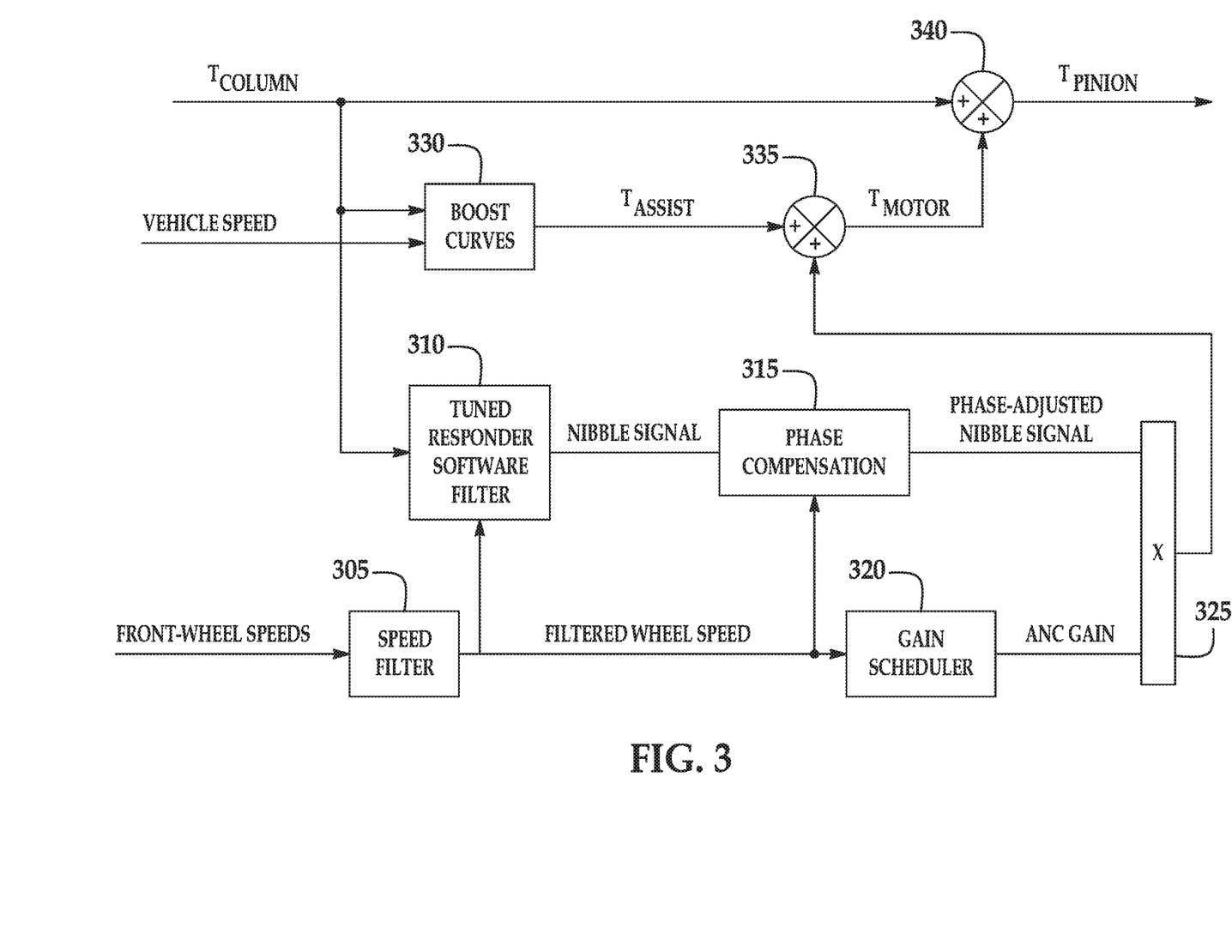
FIG. 3 is a control block diagram for controlling the steering system.

With reference to FIG. 3, the computer 38 is programmed to instruct the electric motor 34 to output a motor torque $T_{MOTOR}$. The computer 38 is programmed to follow a block diagram 300 to determine the motor torque $T_{MOTOR}$ and instruct the electric motor 34 to output the motor torque $T_{MOTOR}$. The pinion gear 64 experiences a pinion torque $T_{PINION}$, which is the combination of the motor torque $T_{MOTOR}$ and the column torque $T_{COLUMN}$, which is the torque transmitted through the steering column 36. In general in the block diagram 300, the motor torque $T_{MOTOR}$ is a combination of an assist torque $T_{ASSIST}$ generated for power-assisted steering and an Automatic Nibble Control (ANC) torque $T_{ANC}$. The ANC torque $T_{ANC}$ includes a phase-adjusted inverted nibble signal generated to cancel out the nibble in the column torque $T_{COLUMN}$. For the purposes of this disclosure, "nibble" is defined as vibrations to the steering system 32 caused by imbalance of the vehicle wheels 38, and "nibble signal" is defined as a representation of the nibble. The block diagram 300 can be applied separately for first-order nibble and second-order nibble, as described below with respect to the tuned resonator software filter 310. The human driver thus experiences less nibble transmitted through the steering column 36 to the steering wheel 60.

Inputs to the block diagram 300 include the column torque $T_{COLUMN}$, a speed of the vehicle 30, and rotational speeds of the front vehicle wheels 58. The steering sensors 56 include, e.g., a torque sensor positioned to detect torque of the steering column 36. The column torque $T_{COLUMN}$ is a torque measured in force times distance, e.g., Newton-meters. The sensors 54 can include a speedometer to measure the vehicle speed. The vehicle speed is a scalar speed measured in distance per unit time, e.g., miles per hour. The steering sensors 56 include, e.g., wheel-speed sensors positioned to detect rotation of the vehicle wheels 58, e.g., rotary encoders, etc. The front-wheel speeds are rotational speeds measured in angular sweep per unit time, e.g., revolutions per second.

The block diagram 300 includes a speed filter 305. The speed filter 305 receives the front-wheel speeds and outputs a filtered wheel speed $f_{wheel}$. The speed filter 305 can use one of the front-wheel speeds, e.g., the front-wheel speed having the greatest noise; alternatively, the speed filter 305 can use an average of both front-wheel speeds. The speed filter 305 applies a filter to the front-wheel speed to reject high-frequency noise and compensate for any lags associated with filtering. Noise is "high-frequency" if the frequency is significantly higher, e.g., an order of magnitude higher, than a highest nibble frequency. Lags can be determined by timing the filtering process.

The block diagram 300 includes a tuned resonator software filter 310. The tuned resonator software filter 310 receives the filtered wheel speed $f_{wheel}$ from the speed filter 305 and receives the column torque $T_{COLUMN}$. The tuned resonator software filter 310 outputs a nibble signal SN isolated from the column torque $T_{COLUMN}$. The tuned resonator software filter 310 first uses the filtered wheel speed $f_{wheel}$ to determine the frequency of either the first-order or second-order nibble. First-order nibble occurs at a frequency equal to the filtered wheel speed $f_{wheel}$, and second-order nibble occurs at a frequency equal to twice the filtered wheel speed $f_{wheel}$. The tuned resonator software filter 310 then filters out frequencies other than the nibble frequency, either first-order or second-order. For example, the tuned resonator software filter 310 can use the second-order filter in the following equation:

$$SN(z) = \frac{(1-R)z^2 + (R-1)}{z^2 - 2R\cos(f_{wheel}T_s)z + R^2} T_{COLUMN}(z)$$

in which R is a discrete decay factor, $f_{wheel}$ is the filtered wheel speed in radians per second, and $T_s$ is a discrete sampling time in seconds. The sample time $T_s$ is the shortest over which the wheel speed can be measured. The discrete decay factor R can be chosen to be very close to 1 to ensure maximum frequency rejection and lowered below 1 to speed up transient buildup as the filtered wheel speed $f_{wheel}$ varies. For example, the discrete decay factor R can be set as 0.985. Alternatively, the discrete decay factor R can vary with vehicle acceleration, being higher when the vehicle 30 is traveling at a constant speed and lower when the vehicle 30 is changing speeds. The second-order filter above has a gain of 1 at the filtered wheel speed $f_{wheel}$ and rapidly attenuates for frequencies away from the filtered wheel speed $f_{wheel}$, leaving an isolated nibble signal SN.

The block diagram 300 includes a phase-compensation block 315. The phase-compensation block 315 receives the nibble signal SN and the filtered wheel speed $f_{wheel}$ and outputs a phase-adjusted nibble signal $SN_\varphi$. The phase-adjusted nibble signal $SN_\varphi$ has the same magnitude as the nibble signal SN, and the phase-adjusted nibble signal $SN_\varphi$ has its phase offset from the phase of the nibble signal SN by a desired phase shift $\varphi(f_{wheel})$ that is based on the filtered wheel speed $f_{wheel}$. The phase-compensation block 315 first determines the desired phase shift $\varphi(f_{wheel})$ for the nibble signal and second applies the desired phase shift $\varphi(f_{wheel})$ to the nibble signal SN to arrive at the phase-adjusted nibble signal $SN_\varphi$. The desired shift $\varphi(f_{wheel})$ compensates for the phase shift of the steering system 32. The phase adjusted nibble $SN_\varphi$ is inverted, i.e., multiplied by −1 or phase-shifted by 180°, compared to the nibble signal SN, which ensures that the phase-adjusted nibble signal $SN_\varphi$ cancels out the nibble as opposed to increasing the nibble. The inversion may be accounted for in the desired phase shift $\varphi(f_{wheel})$ or may be applied separately. The phase-adjusted nibble signal $SN_\varphi$ can ensure that the nibble can be reduced regardless of the phase change caused by the steering system 32 related to the wheel-speed frequency.

The phase-compensation block 315 first determines the desired phase shift $\varphi(f_{wheel})$ based on the filtered wheel speed $f_{wheel}$. The phase-compensation block 315 retrieves the desired phase shift from a lookup table based on the filtered wheel speed. The lookup table is a set of paired filtered wheel frequencies $f_{wheel}$ and desired phase shifts $\varphi$ stored in the memory of the computer 38. An example lookup table is below. For each filtered wheel speed $f_{wheel}$, a corresponding desired phase shift $\varphi$ is selected that substantially minimizes the uncompensated nibble at that filtered wheel speed $f_{wheel}$. For the purposes of this disclosure, "substantially minimizing" the uncompensated nibble means minimizing the nibble so far as noticeable by a human occupant. The minimization of uncompensated nibble may be performed experimentally on the vehicle 30, or the minimization of uncompensated nibble may be performed analytically from a model of the steering system 32 based on characteristics of the components, e.g., motor size, stiffness of the steering column 36, moment of inertia of the steering wheel 60, etc.

| Filtered Wheel Speed $f_{wheel}$ (Hz) | Phase Shift $\varphi$ (°) |
|---|---|
| 8 | 180 |
| 9 | 156 |
| 10 | 129.6 |
| 11 | 110.6 |
| 12 | 69.2 |

Figure 4:
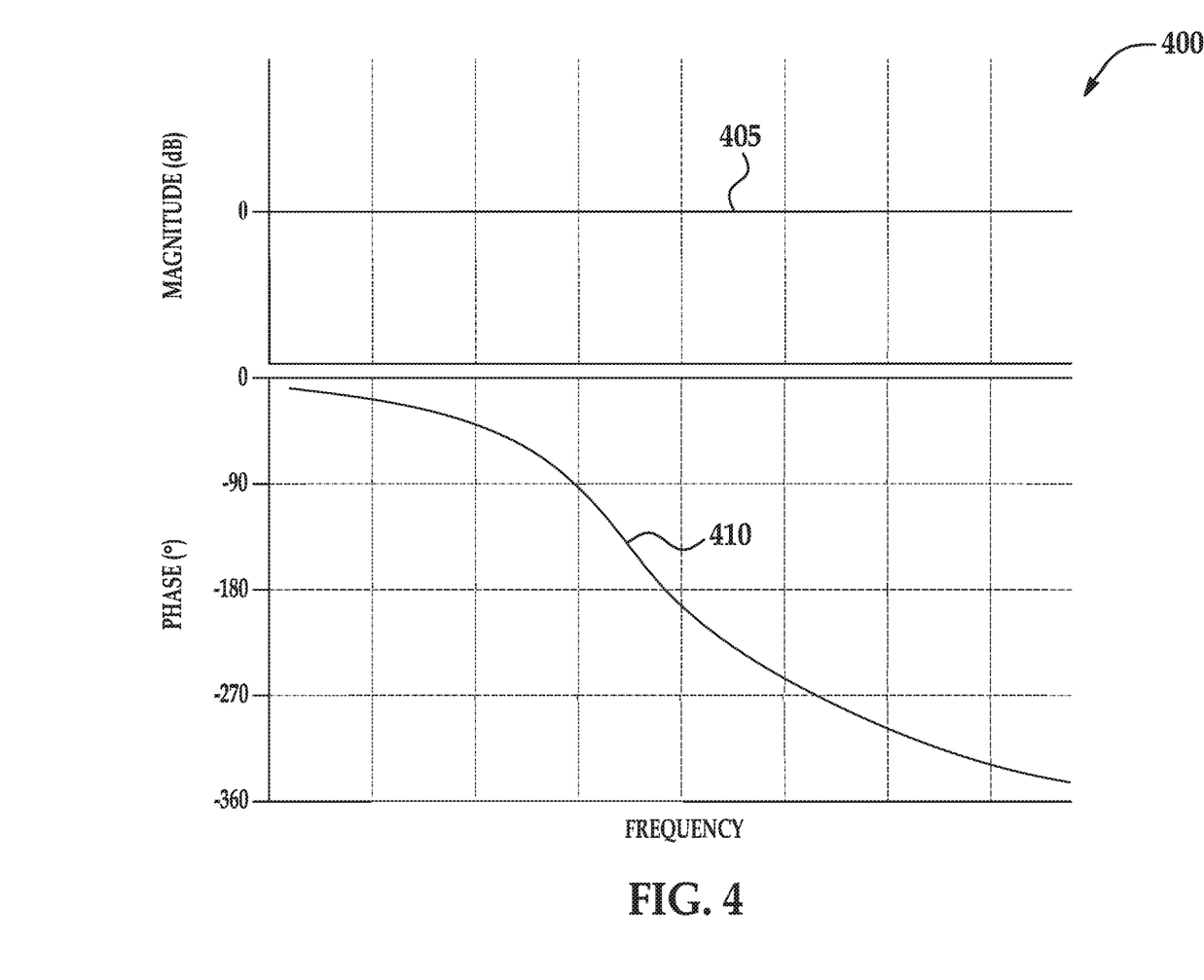
FIG. 4 is a Bode plot of a phase-compensation transfer function.

The phase-compensation second applies the desired phase shift $\varphi(f_{wheel})$ to the nibble signal SN to arrive at the phase-adjusted nibble signal $SN_\varphi$. In a first example, the phase-compensation block 315 shifts the nibble signal SN by applying an all-pass filter to the nibble signal SN. The all-pass filter can be a second-order all-pass filter, e.g., the transfer function in the following equation:

$$SN_\varphi(s) = \frac{s^2 - 2f_{res}s + f_{res}^2}{s^2 + 2f_{res}s + f_{res}^2} SN(s)$$

in which $$f_{res} = \frac{f_{wheel}}{\tan\left((360° - \varphi(f_{wheel}))\frac{\pi}{4*180°}\right)}$$

in which $f_{wheel}$ is the filtered wheel speed and $\varphi(f_{wheel})$ is the desired phase shift of the nibble signal. FIG. 4 shows a Bode plot 400 of this transfer function. The magnitude of the nibble signal SN and the magnitude 405 of the phase-adjusted nibble signal $SN_\varphi$ are the same at all frequencies, i.e., the gain of the transfer function is 0 dB for all frequencies. For a rack-and-pinion steering system, the phase of the typical nibble signal SN and the phase 410 of the phase-adjusted nibble signal $SN_\varphi$ (neglecting inversion) are close to in-phase at low frequencies and get more out-of-phase at higher frequencies, though the steering system 32 can be any type of steering system.

In a second example, the phase-compensation block 315 shifts the nibble signal SN by time-delaying the nibble signal SN by the desired phase shift $\varphi$, i.e., $SN_\varphi(t)=SN(t-T)$, in which the delay time T is a ratio of the desired phase shift to the filtered wheel speed, i.e., $T=\varphi/f_{wheel}$. As a transfer function, the delay is represented as $SN_\varphi(s)=\exp(-sT)SN(s)$. The resolution of the desired phase shifts is limited by the discrete sampling time $T_s$. For example, at a filtered wheel speed $f_{wheel}$ of 8 Hz, the resolution of the phase shift is 12°, so the desired phase shift is selected from a set {12°, 24°, 36°, ... 168°, 180°} to substantially minimize the uncompensated nibble.

The block diagram 300 includes a gain scheduler 320. The gain scheduler 320 receives the filtered wheel speed $f_{wheel}$ and outputs an ANC gain. The ANC gain is determined from the filtered wheel speed $f_{wheel}$ so as to cancel out the nibble in the column torque $T_{COLUMN}$. A lookup table can include paired filtered wheel speeds $f_{wheel}$ and ANC gains. The ANC gains can be selected to equal an expected magnitude of the nibble at the corresponding filtered wheel speed, as determined experimentally.

The block diagram 300 includes a multiplication block 325. The multiplication block 325 receives the phase-adjusted nibble signal and the ANC gain and outputs the ANC torque $T_{ANC}$. The ANC torque $T_{ANC}$ is a product of the phase-adjusted nibble signal and the ANC gain.

The block diagram 300 includes a boost-curve block 330. The boost-curve block 330 receives the column torque $T_{COLUMN}$ and the vehicle speed and outputs an assist torque $T_{ASSIST}$. The assist torque $T_{ASSIST}$ is determined to provide a power assist to help the human driver turn the vehicle wheels 58, as is known.

The block diagram 300 includes a first summation block 335. The first summation block 335 receives the assist torque $T_{ASSIST}$ and the ANC torque $T_{ANC}$ and outputs the motor torque $T_{MOTOR}$. The motor torque $T_{MOTOR}$ is the sum of the assist torque $T_{ASSIST}$ and the ANC torque $T_{ANC}$. The computer 38 instructs the electric motor 34 to output the motor torque $T_{MOTOR}$.

The block diagram includes a second summation block 340. The second summation block 340 receives the motor torque $T_{MOTOR}$ and the column torque $T_{COLUMN}$ and outputs the pinion torque $T_{PINION}$. The second summation block 340 can represent a mechanical summation, i.e., the human driver applies the column torque $T_{COLUMN}$ to the pinion via the steering wheel 60 and steering column 36, and the electric motor 34 applies the motor torque $T_{MOTOR}$ to the pinion. The pinion torque $T_{PINION}$ turns the vehicle wheels 58, steering the vehicle 30.

Figure 5:
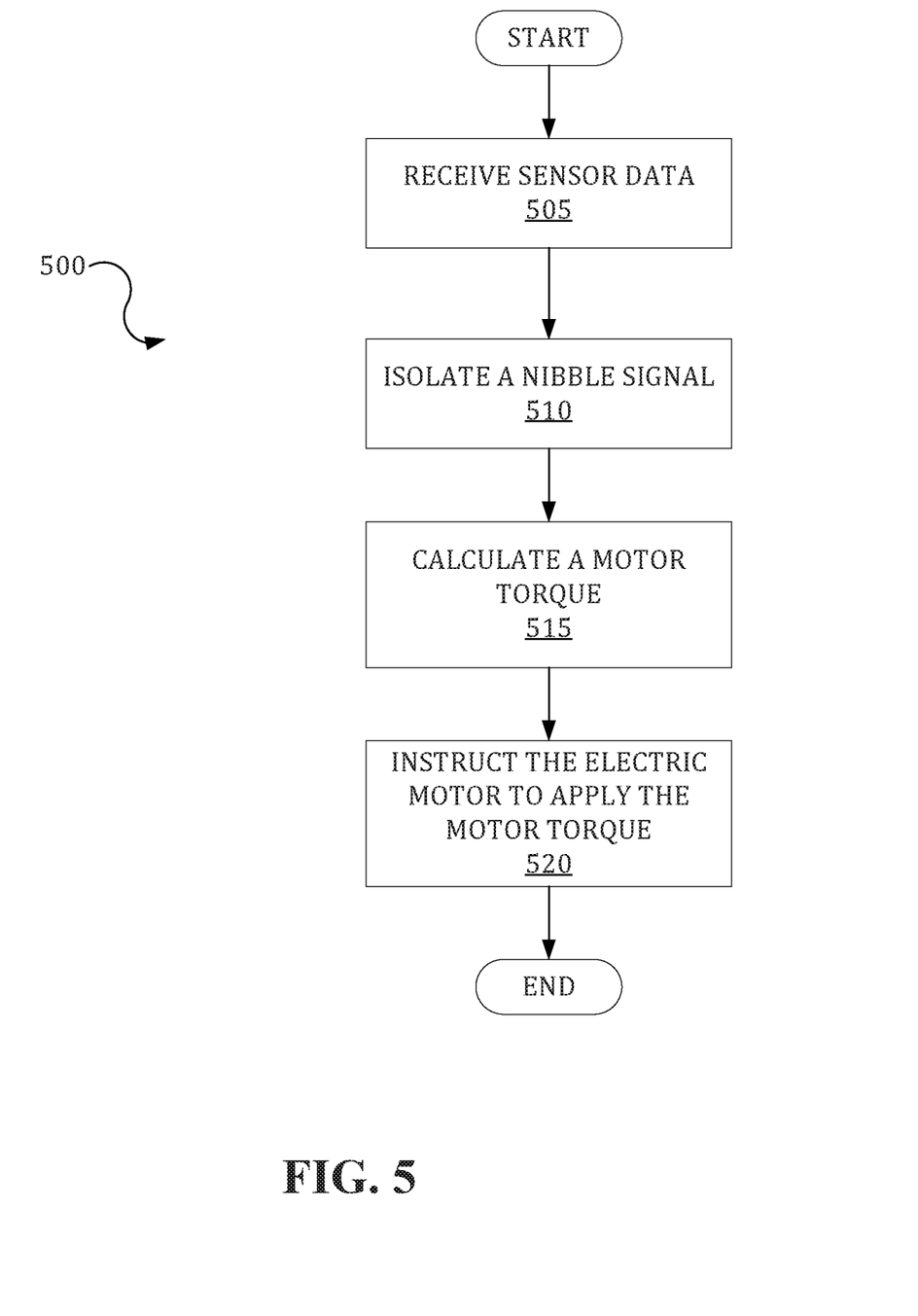
FIG. 5 is a process flow diagram of an example process for controlling the steering system.

FIG. 5 is a process flow diagram illustrating an exemplary process 500 for controlling the steering system 32. The memory of the computer 38 stores executable instructions for performing the steps of the process 500. As a general overview of the process 500, the computer 38 receives sensor data, isolates a nibble signal in the sensor data, calculates the motor torque $T_{MOTOR}$ based on the isolated nibble signal, and instructs the electric motor 34 to apply the motor torque $T_{MOTOR}$. The process 500 is happening substantially continuously, i.e., performed again at each time step; in other words, the computer 38 is substantially constantly instructing the electric motor 34 to apply the motor torque $T_{MOTOR}$, which fluctuates as new sensor data is generated and as the computer 38 isolates the nibble signal in the new sensor data and recalculates the motor torque $T_{MOTOR}$. The time step depends on the hardware of the computer 38.

The process 500 begins in a block 505, in which the computer 38 receives sensor data. The sensor data includes the inputs shown in FIG. 3, namely, the column torque $T_{COLUMN}$, the speed of the vehicle 30, and the rotational speeds of the front vehicle wheels 58, as described above.

Next, in a block 510, the computer 38 isolates the nibble signal from the column torque $T_{COLUMN}$. To do so, the computer 38 uses the calculations described above with respect to the blocks 305 and 310.

Next, in a block 515, the computer 38 calculates the motor torque $T_{MOTOR}$. To do so, the computer 38 uses the calculations described above with respect to the blocks 315, 320, 325, 330, and 335.

Next, in a block 520, the computer 38 instructs the electric motor 34 to apply the motor torque $T_{MOTOR}$ calculated in the block 515. The motor torque $T_{MOTOR}$ combines with the column torque $T_{COLUMN}$ to steer the vehicle 30. After the block 520, the process 500 ends.

In general, the computing systems and/or devices described may employ any of a number of computer operating systems, including, but by no means limited to, versions and/or varieties of the Ford Sync® application, AppLink/Smart Device Link middleware, the Microsoft Automotive® operating system, the Microsoft Windows® operating system, the Unix operating system (e.g., the Solaris® operating system distributed by Oracle Corporation of Redwood Shores, Calif.), the AIX UNIX operating system distributed by International Business Machines of Armonk, N.Y., the Linux operating system, the Mac OSX and iOS operating systems distributed by Apple Inc. of Cupertino, Calif., the BlackBerry OS distributed by Blackberry, Ltd. of Waterloo, Canada, and the Android operating system developed by Google, Inc. and the Open Handset Alliance, or the QNX® CAR Platform for Infotainment offered by QNX Software Systems. Examples of computing devices include, without limitation, an on-board vehicle computer, a computer workstation, a server, a desktop, notebook, laptop, or handheld computer, or some other computing system and/or device.

Computing devices generally include computer-executable instructions, where the instructions may be executable by one or more computing devices such as those listed above. Computer executable instructions may be compiled or interpreted from computer programs created using a variety of programming languages and/or technologies, including, without limitation, and either alone or in combination, Java™, C, C++, Matlab, Simulink, Stateflow, Visual Basic, Java Script, Python, Perl, HTML, etc. Some of these applications may be compiled and executed on a virtual machine, such as the Java Virtual Machine, the Dalvik virtual machine, or the like. In general, a processor (e.g., a microprocessor) receives instructions, e.g., from a memory, a computer readable medium, etc., and executes these instructions, thereby performing one or more processes, including one or more of the processes described herein. Such instructions and other data may be stored and transmitted using a variety of computer readable media. A file in a computing device is generally a collection of data stored on a computer readable medium, such as a storage medium, a random access memory, etc.

A computer-readable medium (also referred to as a processor-readable medium) includes any non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which typically constitutes a main memory. Such instructions may be transmitted by one or more transmission media, including coaxial cables, copper wire and fiber optics, including the wires that comprise a system bus coupled to a processor of a ECU. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

Databases, data repositories or other data stores described herein may include various kinds of mechanisms for storing, accessing, and retrieving various kinds of data, including a hierarchical database, a set of files in a file system, an application database in a proprietary format, a relational database management system (RDBMS), a nonrelational database (NoSQL), a graph database (GDB), etc. Each such data store is generally included within a computing device employing a computer operating system such as one of those mentioned above, and are accessed via a network in any one or more of a variety of manners. A file system may be accessible from a computer operating system, and may include files stored in various formats. An RDBMS generally employs the Structured Query Language (SQL) in addition to a language for creating, storing, editing, and executing stored procedures, such as the PL/SQL language mentioned above.

In some examples, system elements may be implemented as computer-readable instructions (e.g., software) on one or more computing devices (e.g., servers, personal computers, etc.), stored on computer readable media associated therewith (e.g., disks, memories, etc.). A computer program product may comprise such instructions stored on computer readable media for carrying out the functions described herein.

In the drawings, the same reference numbers indicate the same elements. Further, some or all of these elements could be changed. With regard to the media, processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

As used herein, "substantially" means that a shape, structure, measurement, quantity, time, etc. may deviate from an exact described geometry, distance, measurement, quantity, time, etc., because of imperfections in materials, machining, manufacturing, transmission of data, computational speed, etc. The word "substantial" should be similarly understood.

Accordingly, it is to be understood that the above description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

All terms used in the claims are intended to be given their plain and ordinary meanings as understood by those skilled in the art unless an explicit indication to the contrary in made herein. In particular, use of the singular articles such as "a," "the," "said," etc. should be read to recite one or more of the indicated elements unless a claim recites an explicit limitation to the contrary. The adjectives "first" and "second" are used throughout this document as identifiers and are not intended to signify importance or order.

The disclosure has been described in an illustrative manner, and it is to be understood that the terminology which has been used is intended to be in the nature of words of description rather than of limitation. Many modifications and variations of the present disclosure are possible in light of the above teachings, and the disclosure may be practiced otherwise than as specifically described.

What is claimed is:

1. A steering system comprising:
   an electric motor drivably coupled to a steering column; and
   a computer communicatively coupled to the electric motor and programmed to isolate a nibble signal in data representing a torque of the steering column, and instruct the electric motor to output a motor torque based on the nibble signal shifted by a phase shift, the phase shift based on a vehicle-wheel frequency;
   wherein shifting the nibble signal by the phase shift includes applying an all-pass filter to the nibble signal.

2. The steering system of claim 1, wherein the electric motor is an electric-power-assist-steering motor.

3. The steering system of claim 2, wherein the motor torque is a sum of (1) a power-assist torque determined from the steering-column torque and (2) the nibble signal shifted by the phase shift.

4. The steering system of claim 1, further comprising a torque sensor communicatively coupled to the computer and positioned to detect a torque of the steering column.

5. The steering system of claim 1, further comprising a vehicle wheel turnable by the steering column, and a wheel-speed sensor communicatively coupled to the computer and positioned to detect rotation of the vehicle wheel.

6. The steering system of claim 1, wherein the all-pass filter is a second-order all-pass filter.

7. The steering system of claim 1, wherein isolating the nibble signal includes applying a tuned resonator software filter, the tuned resonator software filter is a function of a discrete sampling time, and the discrete sampling time is a shortest time over which the vehicle-wheel frequency can be measured.

8. A computer comprising a processor and a memory storing instructions executable by the processor to:
   isolate a nibble signal in data representing a steering-column torque; and
   instruct an electric motor to output a motor torque based on the nibble signal shifted by a phase shift, the phase shift based on a vehicle-wheel frequency;
   wherein shifting the nibble signal by the phase shift includes applying an all-pass filter to the nibble signal.

9. The computer of claim 8, wherein the all-pass filter is a second-order all-pass filter.

10. The computer of claim 8, wherein the memory stores a lookup table of vehicle-wheel frequencies paired with phase shifts, wherein the phase shifts substantially minimize uncompensated nibble at the respective vehicle-wheel frequencies.

11. The computer of claim 8, wherein shifting the nibble signal by the phase shift includes time-delaying the nibble signal.

12. The computer of claim 8, wherein the motor torque is a sum of (1) a power-assist torque determined from the steering-column torque and (2) an inversion of the nibble signal shifted by the phase shift.

13. The computer of claim 8, wherein isolating the nibble signal includes applying a tuned resonator software filter.

14. The computer of claim 13, wherein the tuned resonator software filter is a function of a discrete sampling time, and the discrete sampling time is a shortest time over which the vehicle-wheel frequency can be measured.

15. A method comprising:
    isolating a nibble signal in data representing a steering-column torque; and
    instructing an electric motor to output a motor torque based on the nibble signal shifted by a phase shift, the phase shift based on a vehicle-wheel frequency;
    wherein shifting the nibble signal by the phase shift includes applying an all-pass filter to the nibble signal.

16. The method of claim 15, wherein the all-pass filter is a second-order all-pass filter.

17. The method of claim 15, further comprising determining the phase shift by consulting a lookup table of vehicle-wheel frequencies paired with phase shifts, wherein the phase shifts minimize uncompensated nibble at the respective vehicle-wheel frequencies.

18. The method of claim 15, wherein the motor torque is a sum of (1) a power-assist torque determined from the steering-column torque and (2) an inversion of the nibble signal shifted by the phase shift.

19. The method of claim 15, wherein isolating the nibble signal includes applying a tuned resonator software filter.

20. The method of claim 19, wherein the tuned resonator software filter is a function of a discrete sampling time, and the discrete sampling time is a shortest time over which the vehicle-wheel frequency can be measured.

* * * * *